(12) United States Patent
Wintersteen et al.

(10) Patent No.: US 6,944,020 B2
(45) Date of Patent: Sep. 13, 2005

(54) COMPUTER ENCLOSURE AIR DISTRIBUTION SYSTEM

(75) Inventors: Douglas Charles Wintersteen, Burt, NY (US); David M. Chatt, Lockport, NY (US); Chad S. Pinger, Clarence Ctr, NY (US); Luke E. O'Dwyer, Getzville, NY (US)

(73) Assignee: Delphi Technologies, Inc., Troy, MI (US)

( * ) Notice: Subject to any disclaimer, the term of this patent is extended or adjusted under 35 U.S.C. 154(b) by 35 days.

(21) Appl. No.: 10/377,537

(22) Filed: Feb. 28, 2003

(65) Prior Publication Data

US 2003/0235035 A1 Dec. 25, 2003

Related U.S. Application Data

(60) Provisional application No. 60/390,265, filed on Jun. 20, 2002.

(51) Int. Cl.[7] ................................................ G06F 1/20
(52) U.S. Cl. .............. 361/687; 165/80.3; 165/104.33; 415/178; 415/214.1
(58) Field of Search ............................. 361/687, 695, 361/724–727; 165/80.3, 120–126, 104.33; 415/177, 178, 213.1, 214.1

(56) References Cited

U.S. PATENT DOCUMENTS

| | | | |
|---|---|---|---|
| 4,672,509 A | * | 6/1987 | Speraw ........................ 361/687 |
| 5,412,534 A | * | 5/1995 | Cutts et al. .................. 361/695 |
| 5,474,422 A | | 12/1995 | Sullivan ..................... 415/206 |
| 5,772,500 A | | 6/1998 | Harvey et al. .............. 454/184 |
| 6,061,237 A | | 5/2000 | Sands et al. ................ 361/695 |
| 6,246,579 B1 | * | 6/2001 | Lin ............................. 361/695 |
| 6,297,950 B1 | * | 10/2001 | Erwin ......................... 361/685 |
| 6,328,097 B1 | * | 12/2001 | Bookhardt et al. ..... 165/104.33 |
| 6,343,984 B1 | | 2/2002 | Langdon et al. ............ 454/184 |
| 6,362,958 B1 | * | 3/2002 | Yu et al. ..................... 361/687 |
| 6,525,935 B2 | * | 2/2003 | Casebolt ..................... 361/687 |
| 2001/0024358 A1 | | 9/2001 | Bonet ......................... 361/695 |
| 2001/0028550 A1 | | 10/2001 | Miyake et al. ............. 361/695 |
| 2001/0028551 A1 | | 10/2001 | Ota et al. ................... 361/695 |
| 2003/0002254 A1 | * | 1/2003 | Faneuf et al. .............. 361/687 |
| 2003/0223193 A1 | * | 12/2003 | Smith et al. ................ 361/687 |

FOREIGN PATENT DOCUMENTS

GB          2318972          5/1998

* cited by examiner

*Primary Examiner*—Lisa Lea-Edmonds
(74) *Attorney, Agent, or Firm*—Patrick M. Griffin

(57) ABSTRACT

A computer cabinet includes a top panel and at least one side panel connected to the top panel and a fan assembly. The fan assembly includes a fan and a fan housing. The fan housing has a top half and bottom half. The top half and the bottom half form an internal cavity. An air inlet is located within one of the top and bottom halves. The fan is located within the internal cavity and directs air from the air inlet towards an open end of the housing.

21 Claims, 5 Drawing Sheets

COMPUTER ENCLOSURE AIR DISTRIBUTION SYSTEM

RELATED APPLICATION

This application claims priority to U.S. Provisional Patent Application 60/390,265, filed Jun. 20, 2002.

FIELD OF THE INVENTION

The present invention relates generally to computer enclosures, and more specifically to a computer enclosure air distribution system with a centrifugal fan enclosed in a plastic housing

BACKGROUND OF THE INVENTION

Data processing and telecommunications computer centers typically have a number of locked enclosures in a room that contains a number of computer servers. The servers are generally stacked and mounted vertically in standardized racks, i.e., server cabinets which are typically about 19 inches wide. Many of these computer centers utilize raised floor air conditioning systems that deliver cool air to the bottom of the server cabinets via holes or perforations in the floor tiles underneath the cabinet.

Computer server designs are becoming more compact in size, specifically height, and provide more capability. Thus, more servers may be fit into the same sized cabinet, thereby generating more heat inside the cabinet.

Most server designs are cooled internally by employing, small axial fans which draw cool air in from the front of the server and exhaust warmer air out the back of the server. As stated above, the reduced height servers may be packed more densely within the cabinet. This may result in the temperature near the top of the enclosure being much warmer than the air near the cool air provided at the floor of the cabinet. This increase in heat may reduce the performance and durability of the server components.

One approach to cooling servers in a server rack uses a radial fan located in a generally rectangular internal cavity of a housing mounted on rails. The fan housing is mounted horizontally over an aperture located, for example, in a floor of the enclosure. The fan is located at one end of the housing in the internal cavity. The housing may include an opening in the top of the surface housing at an opposite end to permit air flow out of the housing.

However, the generally rectangular shape of the interior housing results in an uneven air flow out of the fan housing, which again, may result in reduced performance and durability of the server components.

The present invention is aimed at one or more of the problems identified above.

SUMMARY OF THE INVENTION AND ADVANTAGES

In one aspect of the present invention, a fan assembly for use in a computer cabinet is provided. The cabinet includes a top panel and at least one side panel connected to the top panel. The top panel and the at least one side panel form the cabinet. The fan assembly includes a fan and a fan housing. The fan housing includes a top half and a bottom half. The top half and the bottom half form an internal cavity and an air inlet. The fan is located within the internal cavity for directing air from the air inlet towards an open end of the fan housing. The internal cavity has a scroll portion and a volute portion. The volute portion has a narrow portion connected to the scroll portion and expands towards the open end of the housing.

In another aspect of the present invention, a fan assembly for use in a computer cabinet is provided. The cabinet includes a top panel and at least one side panel connected to the top panel. The top panel and the at least one side panel form the cabinet. The fan assembly includes a fan and a fan housing. The fan housing includes a top half and a bottom half. The top half and the bottom half form an internal cavity and an air inlet. The fan is located within the internal cavity for directing air from the air inlet towards an open end of the fan housing. A front nozzle is connected to the fan housing at the open end of the fan housing.

In still another aspect of the present invention, a computer cabinet is provided. The cabinet includes a top panel and at least one side panel connected to the top panel. The top panel and the at least one side panel form the cabinet. The fan assembly includes a fan and a fan housing. The fan housing includes a top half and a bottom half. The top half and the bottom half form an internal cavity and an air inlet. The fan is located within the internal cavity for directing air from the air inlet towards an open end of the fan housing. The internal cavity has a scroll portion and a volute portion. The volute portion has a narrow portion connected to the scroll portion and expands towards the open end of the housing.

In still one more aspect of the present invention, a computer cabinet is provided. The cabinet includes a top panel and at least one side panel connected to the top panel. The top panel and the at least one side panel form the cabinet. The fan assembly includes a fan and a fan housing. The fan housing includes a top half and a bottom half. The top half and the bottom half form an internal cavity and an air inlet. The fan is located within the internal cavity for directing air from the air inlet towards an open end of the fan housing. A front nozzle is connected to the fan housing at the open end of the fan housing.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
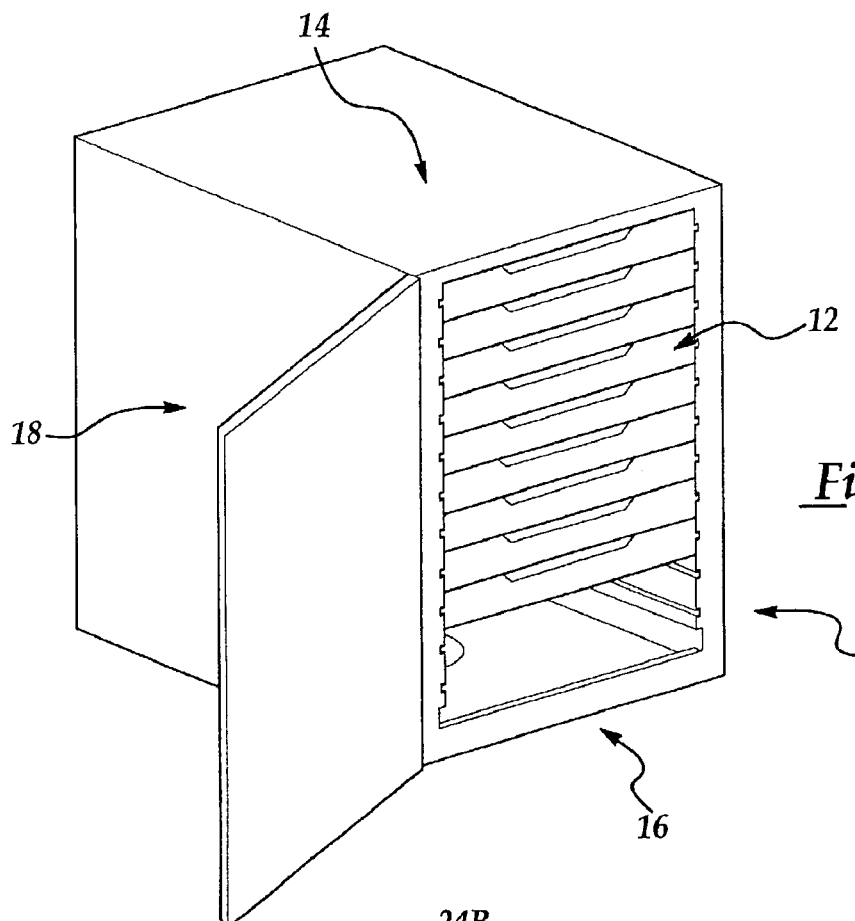
FIG. 1 is a diagrammatic illustration of a rack assembly for a plurality of computer servers.

With reference to the drawings, and in operation, the present invention provides a computer enclosure air distribution system for use in a computer cabinet 10. With particular reference to FIG. 1, one example of a computer cabinet 10 in which the present invention is suitably adapted to is a rack-type computer cabinet 10 designed to hold a plurality of computer servers 12. The computer servers 12 are stored in the computer cabinet 10 mounted to a rack system (see below).

As shown in FIG. 1, the computer cabinet 10 includes a top panel 14 and at least one side panel 18. In the illustrated embodiment, the computer cabinet 10 includes three side panels 18, only one of which is shown. Additionally, a front side panel may be included to compete the enclosure. The front side panel may include a hinged access panel, i.e., a door, which allows the computer cabinet 10 to be opened and closed for the insertion/removal/repair of the computer servers.

Figure 2:
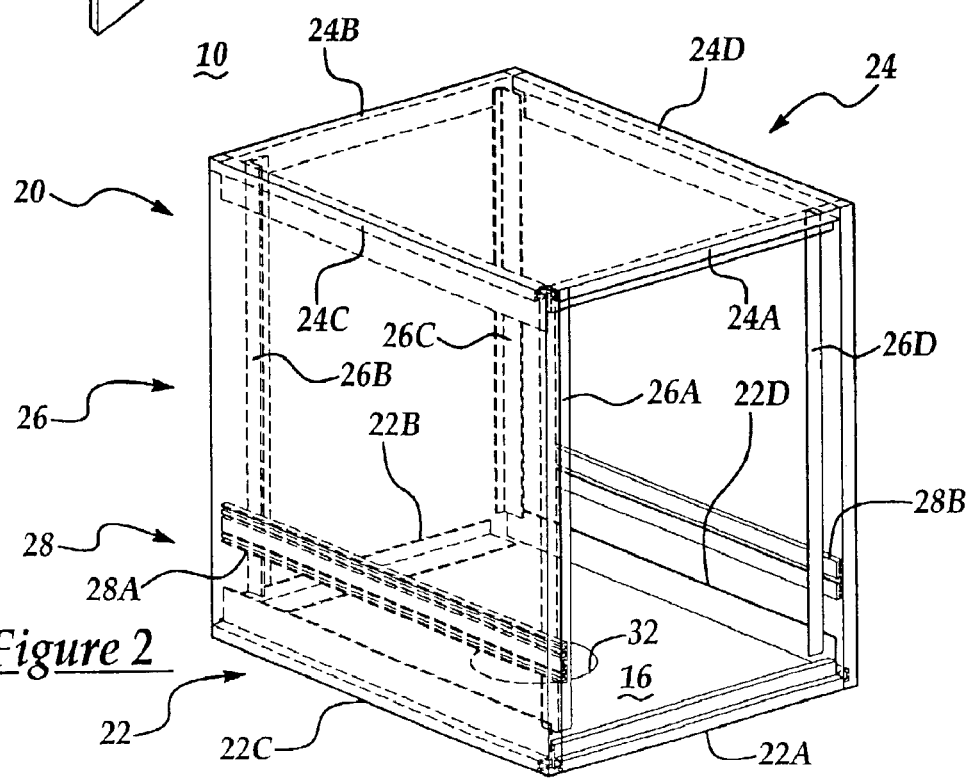
FIG. 2 is an exploded view of a portion of the rack assembly of FIG. 1.
Figure 3:
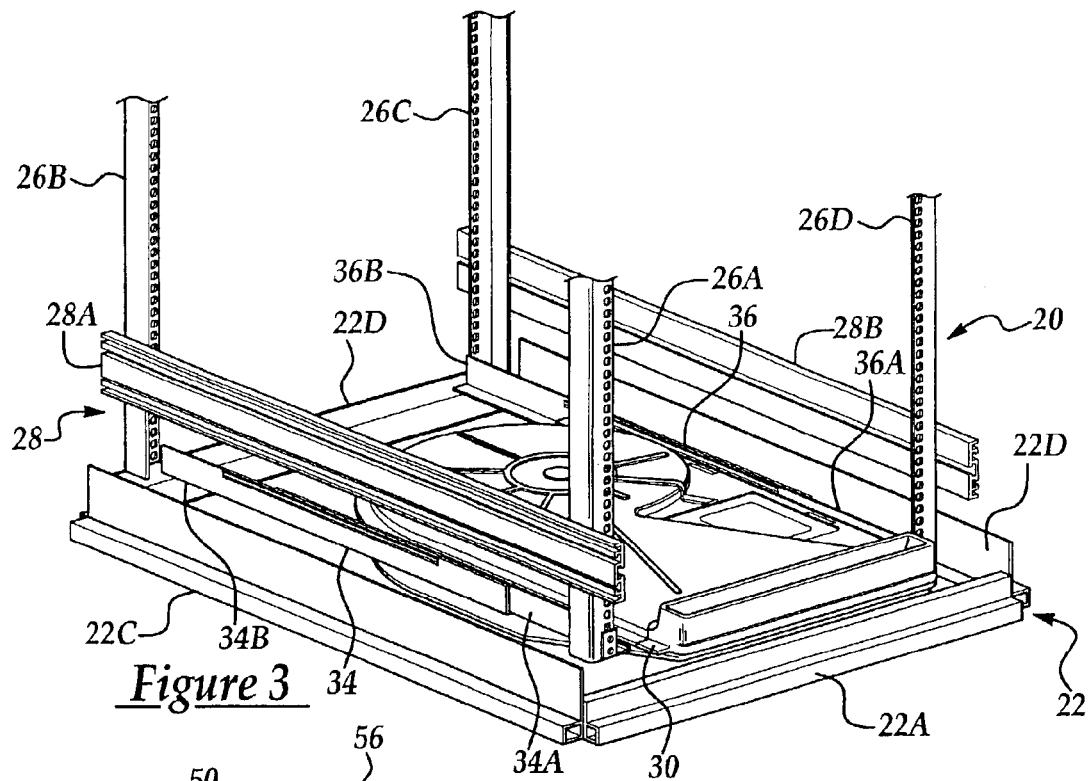
FIG. 3 is a partial view of the rack assembly of FIG. 2 having a fan assembly, according to an embodiment of the present invention.
Figure 4:
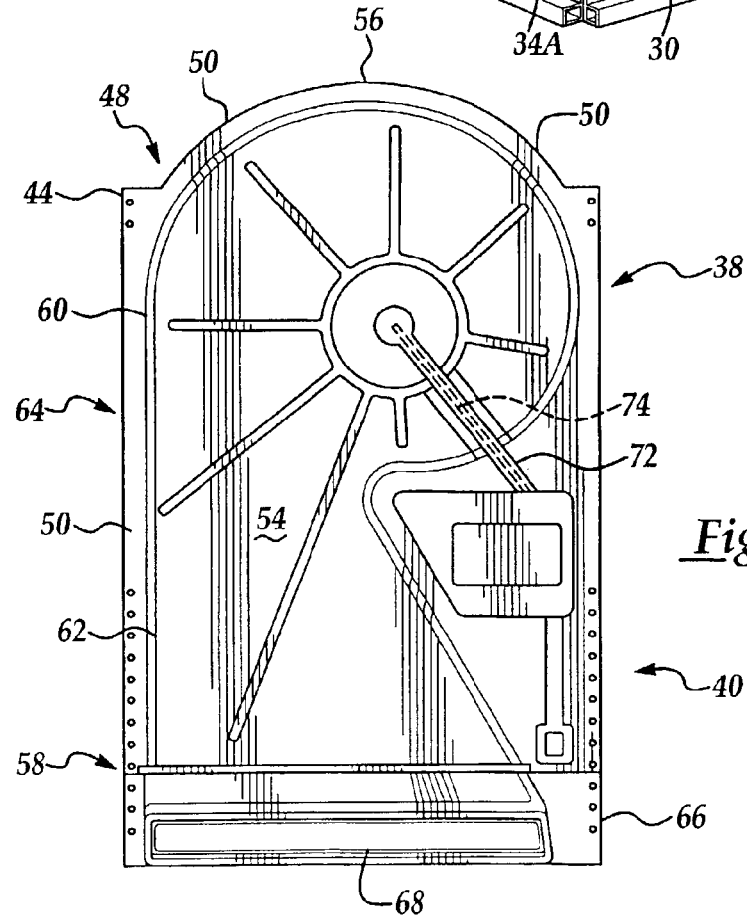
FIG. 4 is a top down view of a top portion of the fan assembly of FIG. 3.
Figure 5:
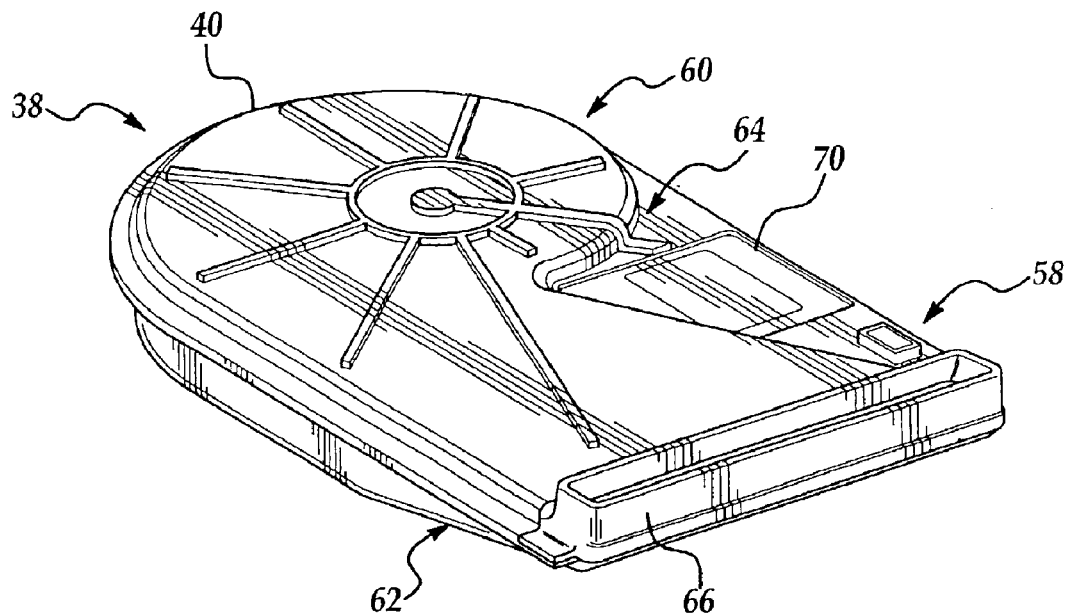
FIG. 5 is a perspective view of the top portion of the fan assembly of FIG. 4.
Figure 6:
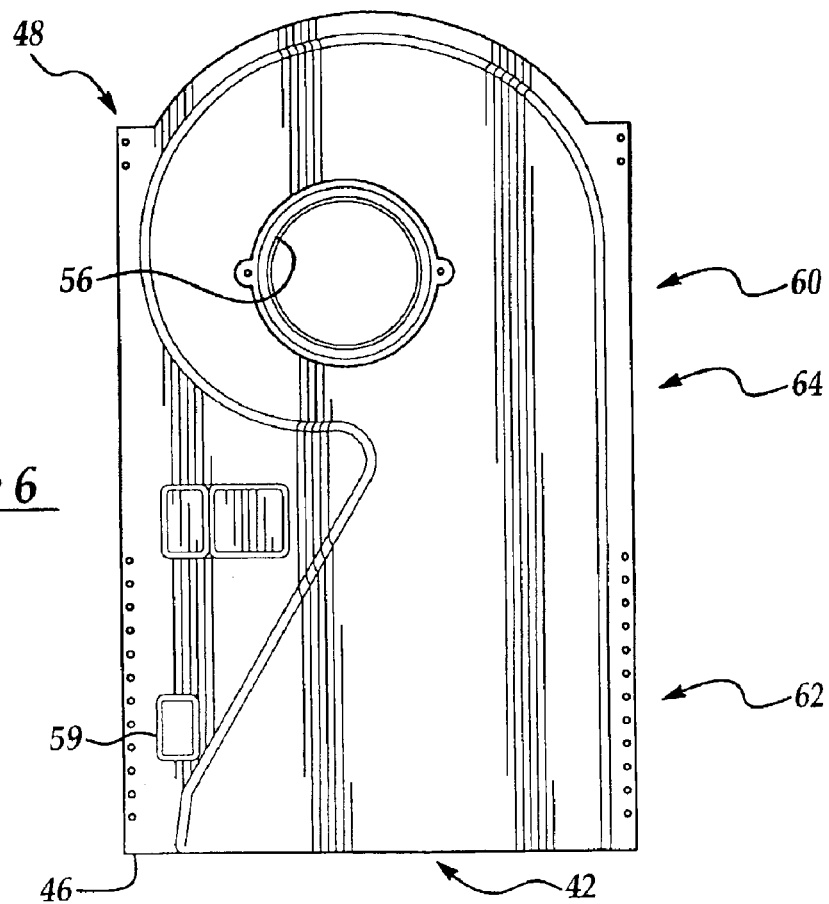
FIG. 6 is a top down view of a bottom portion of the fan assembly of FIG. 3.
Figure 7:
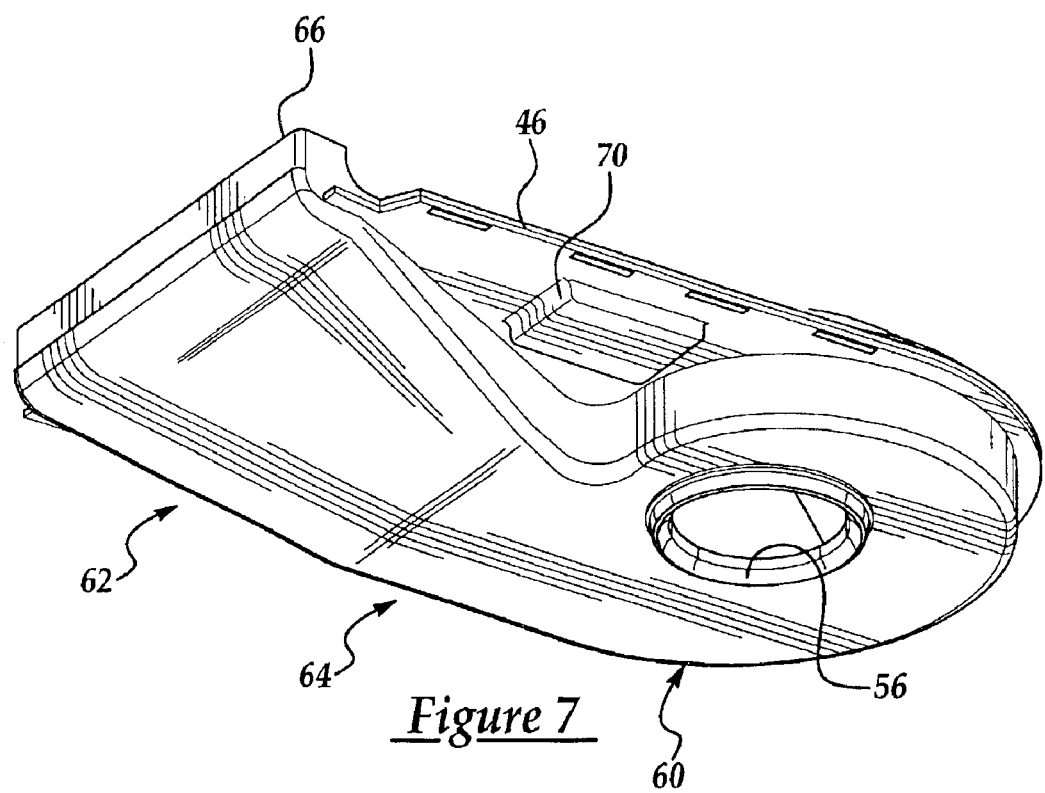
FIG. 7 is a perspective view of the bottom portion of the fan assembly of FIG. 6.
Figure 8:
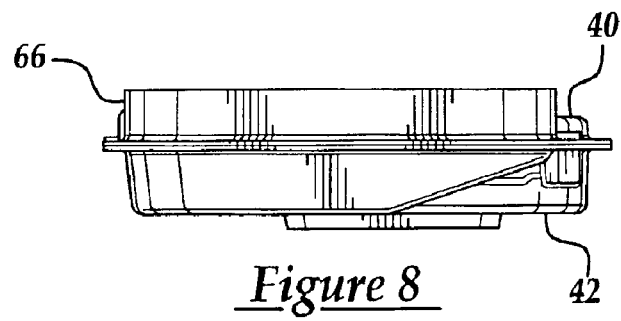
FIG. 8 is a first side view of the fan assembly of FIG. 3.
Figure 9:
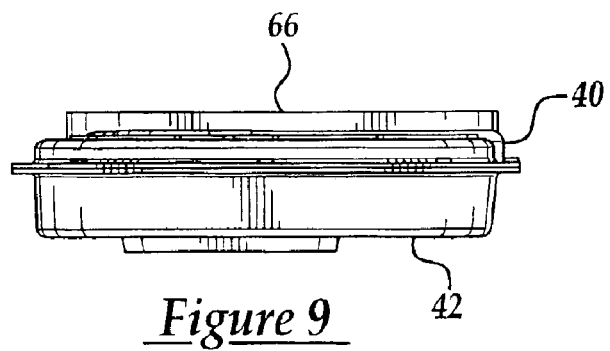
FIG. 9 is a second side view of the fan assembly of FIG. 3.
Figure 10:
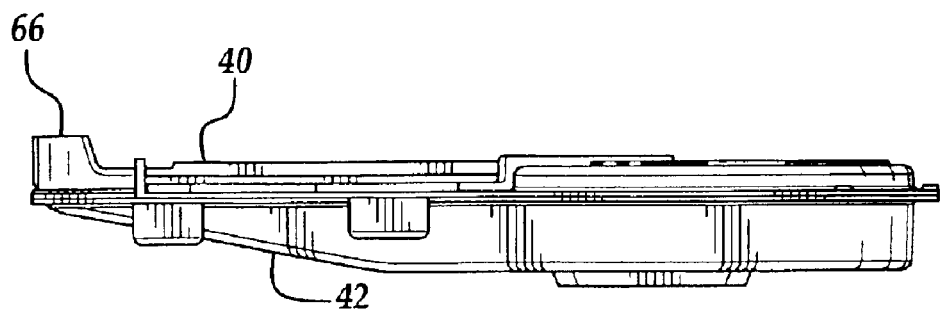
FIG. 10 is a third side view of the fan assembly of FIG. 3.
Figure 11:
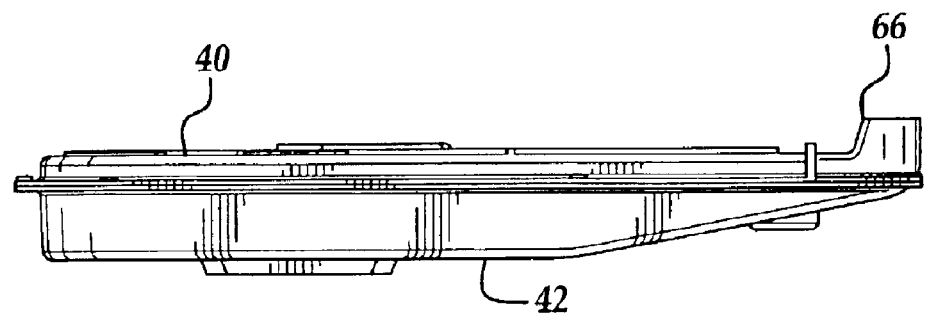
FIG. 11 is a fourth side view of the fan assembly of FIG. 3.

With reference to FIGS. 2 and 3, the computer cabinet 10 includes a frame 20 to which the panels 14, 18 are connected using suitable fasteners, such as screws, thumb-screws, rivets, clips, etc. . . . . The frame 20 includes a bottom portion 22 and a top portion 24 which are connected by a plurality of upright members 26. In the illustrated embodiment, the bottom portion 22 includes front and back members 22A, 22B, and two side rails 22C, 22D and the top portion 24 includes front and back members 24A, 24B and two side rails 24C, 22D. The frame 20 includes first, second, third, and fourth upright members 26A, 26B, 26C, 26D which are connected between corners of the top and bottom portions 22, 24. In one embodiment, the computer cabinet 10 includes a bottom panel 16 coupled to the bottom portion 22 of the frame 20. In another embodiment the bottom panel 16 is formed by the floor 16 on which the cabinet 10 is located. In the latter embodiment, the cabinet may or may not be fixed or otherwise secured to the floor 16.

With particular reference to FIG. 2, in the illustrated embodiment, the bottom panel 16 includes an aperture 32. The computer cabinet 10 may further include at least one pair of rails 26. The computer server 12 may be secured in the computer cabinet 10 to the upright members or vertical rails 26A, 26B, 26C, 26D by a plurality of fasteners (not shown) or other suitable mechanism. Such systems are well known in the art and are therefore not further discussed.

With particular reference to FIG. 3, the computer enclosure air distribution system includes a fan assembly 30 for circulating air into the computer cabinet 10, at least sometimes through an aperture 32 in the bottom panel or floor 16 and redirecting the flow of air. The fan assembly 30 includes a housing 38. A pair of fan rails 34, 36 are coupled to the frame 20. The pair of fan rails 34, 36 are adapted to slidably receive the fan-assembly 30.

In the illustrated embodiment, each fan rail 34, 36 includes a front portion 34A, 36A and a back portion 34B, 36B. The front and back portions 34A, 36A, 34B, 36B are slidably engaged such that the overall length of each fan rail 34, 36 is adjustable to accommodate computer cabinets with different depth dimensions.

In the illustrated embodiment, each rail 34, 36 includes a flange (not shown) having at least one aperture. Each upright member 26A, 26B, 26C, 26D also includes a plurality of apertures. The fan rails 34, 36 may be secured to the frame 20 by a plurality of fasteners or other mechanism (not shown). For example a threaded fastener may be threaded through the at least one aperture in the flange and a corresponding aperture in an upright member 26A, 26B, 26C, 26D.

With reference to FIGS. 4–7, the fan assembly 30 includes a fan housing 38. In the illustrated embodiment, the fan housing 38 includes a top half 40 and a bottom half 42. The top half 40 and the bottom half 42 each include an outer flange 44, 46 around at least a portion of its outer edge. The outer flanges 44, 46 may include a plurality of apertures 48 for receiving fasteners 50, e.g., screws, rivets, or clips. The top half 40 and the bottom half 42 are held together by an adhesive and/or the fasteners 50 to form the fan housing 38.

Figure 12:
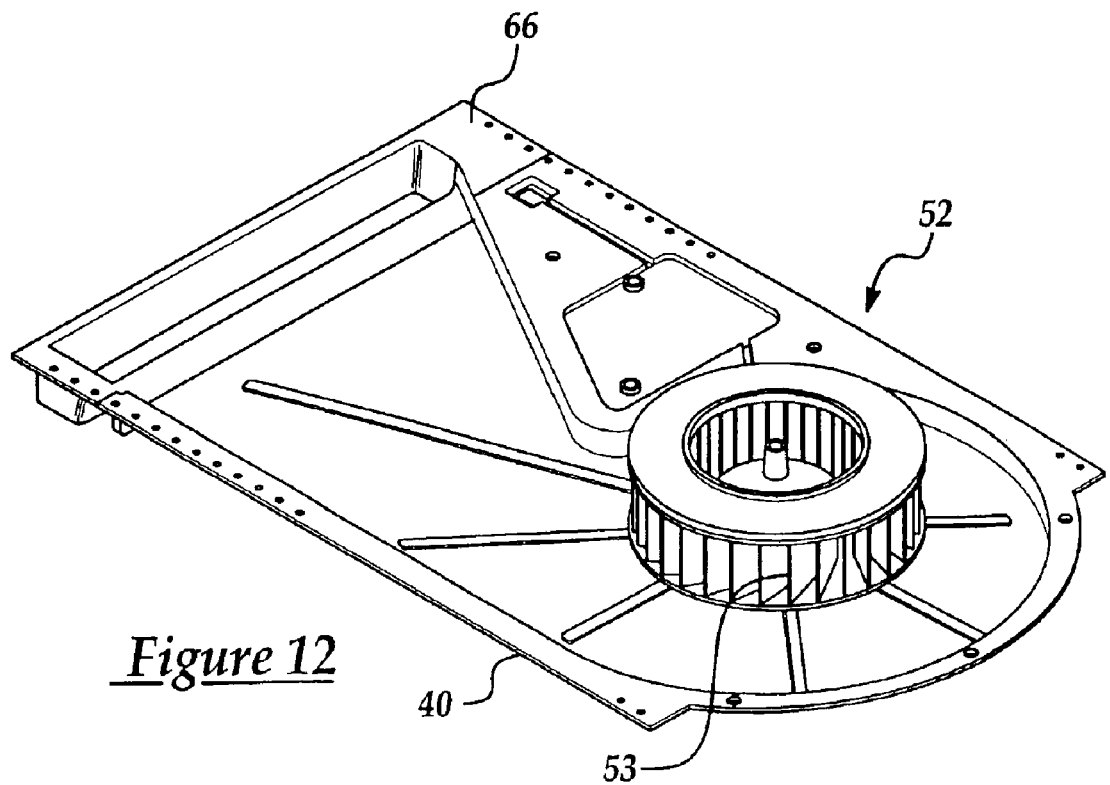
FIG. 12 is a perspective interior view of the fan assembly of FIG. 3.

With reference to FIG. 12 in the illustrated embodiment, the fan assembly 30 includes a centrifugal fan 52 connected to the top half 40 of the fan housing 38. In one embodiment the centrifugal fan 52 includes a plurality of backward inclined fan blades 53, although forward inclined fan blades may also be used. The centrifugal fan 52 also includes an electric motor for rotating the fan blades when electrical power is applied. Suitable centrifugal fans 52 are well known in the art and are therefore not further discussed.

The fan assembly 30 forms an internal cavity 54 and an air inlet 56 located on one of the top and bottom halves 40, 42 (shown as being located in the bottom half 42). The fan 52 is located generally within the internal cavity 54 and directs air from the air inlet towards an open end 58 of the fan housing 38. The internal cavity 54 includes scroll portion 60 and a volute portion 62. The volute portion 62 includes a narrow portion 64 connected to the scroll portion 60 and expands towards the open end 58 of the fan housing 38. In another aspect of the present invention, the fan 52 is provided with an on/off switch (not shown) which projects from an on/off switch cavity 59.

In one embodiment, the fan assembly 30 further includes a front nozzle 66 which is connected to the housing 38 at the of the open end 58 of the housing 38. The front nozzle 66 directs air flow out of the fan assembly 30 in a desired direction. In the illustrated embodiment, the front nozzle 66 directs the air flow at an angle generally 90 degrees from the direction of air flow out of the open end 58. In one embodiment, the front nozzle 66 may be removably coupled to the housing 38 via a snap-fit. In another embodiment, the front nozzle 66 may be removably coupled to the housing 38 using a fastener (not shown), such as a threaded fastener. In one aspect of the present invention, the fan assembly 30 includes an air filter 68. In one embodiment, the air filter 68 is located in the outlet side of the fan assembly 30, e.g., within the front nozzle 66. In another embodiment, the air filter 68 is located on the inlet side of the fan assembly 30.

The centrifugal fan 52 is powered via a junction box 70 which may be integrally molded with the housing 38. Electrical power is supplied to the junction box 70 by a power cord, which is connected at one end to the junction box 70 and to a power supply, e.g., an 115 volt, 60 Hz, alternating current power supply (not shown), at the other end. The power cord may be detachable. Power is supplied to the electrical motor of the fan 52 via a fan power cord 72.

In the illustrated embodiment, the top half 40 of the housing 38 includes a hollow rib 74 for receiving the fan power cord 72 (indicated by a dashed line).

In another aspect of the present invention, the air distribution system may include one or more thermostats which are positioned at desired locations within the computer cabinet 10. The thermostats sense a temperature at their locations. The system controls the fan, i.e., turns the fan on and off to maintain a desired temperature.

In use, the illustrated embodiment of the present invention provides a fan assembly 30 for use in a computer cabinet 10 which draws cool air from the floor through the aperture 25 in the bottom panel or floor 16 and directs the flow of air through the detachable front nozzle 66 in an upward vertical direction between the front of the computer servers 12 and the front of the computer cabinet 10.

The design of the fan housing 38, i.e., the shape of the internal cavity 54, optimizes air flow from the fan assembly 30, ensures a generally uniform air flow out of the open end 58 or the front nozzle 66. Additionally, the internal cavity 54 reduces undesirable tonal noise characteristics and provides for installation in a compact space.

Obviously, many modifications and variations of the present invention are possible in light of the above teachings. The invention may be practiced otherwise than as specifically described within the scope of the appended claims.

What is claimed is:

1. A fan assembly for use in a computer cabinet, the cabinet having a top panel and at least one side panel connected to the top panel, the top panel and the at least one side panel forming the cabinet, comprising:
    a fan;
    a fan housing having a top half and bottom half, the top half and the bottom half forming an internal cavity, an air inlet being located on one of the top and bottom halves, the fan being located within the internal cavity for directing air from the air inlet towards an open end of the fan housing, the internal cavity have a scroll portion and a volute portion, the volute portion having a narrow portion being connected to the scroll portion and expanding towards the open end of the housing; and,
    a front nozzle connected to the housing at the open end of the housing, the front nozzle being removable.

2. A fan assembly, as set forth in claim 1, further including an air filter removably located within the fan housing.

3. A fan assembly, as set forth in claim 2, wherein the air filter is located near the air inlet.

4. A fan assembly for use in a computer cabinet, the cabinet having a top panel and at least one side panel connected to the top panel, the top panel and the at least one side panel forming the cabinet, comprising:
    a fan;
    a fan housing having a top half and bottom half, the top half and the bottom half forming an internal cavity, an air inlet being located on one of the top and bottom halves, the fan being located within the internal cavity for directing air from the air inlet towards an open end of the fan housing, the internal cavity have a scroll portion and a volute portion, the volute portion having a narrow portion being connected to the scroll portion and expanding towards the open end of the housing;
    a front nozzle connected to the housing at the open end of the housing; and,
    an air filter removable located within the fan housing the air filter being within the front nozzle near the air inlet.

5. A fan assembly for use in a computer cabinet, the cabinet having a top panel and at least one side panel connected to the top panel, the top panel and the at least one side panel forming the cabinet, comprising:
    a fan;
    a fan housing having a top half and bottom half, the top half and the bottom half forming an internal cavity, an air inlet being located on one of the ton and bottom halves, the fan being located within the internal cavity for directing air from the air inlet towards an open end of the fan housing, the internal cavity have a scroll portion and a volute portion, the volute portion having a narrow portion being connected to the scroll portion and expanding towards the open end of the housing; and,
    a front nozzle connected to the housing at the open end of the housing the front nozzle being adapted to direct air flow out of the open end of the fan housing in a direction generally at a right angle thereto.

6. A fan assembly for use in a computer cabinet, the cabinet having a top panel and at least one side panel connected to the top panel, the top panel and the at least one side panel forming the cabinet, comprising:
    a fan;
    a fan housing having a top half and bottom half the top half and the bottom half forming an internal cavity, an air inlet being located on one of the top and bottom halves, the fan being located within the internal cavity for directing air from the air inlet towards an open end of the fan housing, the internal cavity have a scroll portion and a volute portion, the volute portion having a narrow portion being connected to the scroll portion and expanding towards the open end of the housing, the fan housing including an electrical junction box; and,
    a fan power cord connected between the electrical junction box and the fan.

7. A fan assembly, as set forth 6, further comprising a hollow rib located on an outer surface of the volute portion.

8. A fan assembly, as set forth in claim 7, wherein the fan power cord is located within the hollow rib.

9. A fan assembly for use in a computer cabinet, the cabinet having a top panel and at least one side panel connected to the top panel, the top panel and the at least one side panels forming the cabinet, comprising:
    a fan;
    a fan housing having a top half and bottom half, the top half and the bottom half forming an internal cavity, an air inlet being located with one of the top and bottom halves, the fan being located within the internal cavity for directing air from the air inlet towards an open end of the fan housing; and,
    a front nozzle detachedly connected to the fan housing at the open end of the fan housing.

10. A fan assembly for use in a computer cabinet, the cabinet having a top panel and at least one side panel connected to the top panel, the top panel and the at least one side panels forming the cabinet, comprising:
    a fan;
    a fan housing having a top half and bottom half, the top half and the bottom half forming an internal cavity, an air inlet being located with one of the top and bottom halves, the fan being located within the internal cavity for directing air from the air inlet towards an open end of the fan housing;
    a front nozzle connected to the fan housing at the open end of the fan housing; and,
    a bottom panel, the bottom panel including at least one aperture and wherein the air inlet of the fan housing is located adjacent the at least one aperture.

11. A fan assembly for use in a computer cabinet, the cabinet having a top panel and at least one side panel connected to the top panel, the top panel and the at least one side panels forming the cabinet, comprising:

a fan;

a fan housing having a top half and bottom half, the top half and the bottom half forming an internal cavity, an air inlet being located with one of the top and bottom halves, the fan being located within the internal cavity for directing air from the air inlet towards an open end of the fan housing; and, a front nozzle connected to the fan housing at the open end of the fan housing; and, an air filter removably located within housing near the air inlet, wherein the air filter is within the front nozzle.

12. A fan assembly for use in a computer cabinet, the cabinet having a top panel and at least one side panel connected to the top panel, the top panel and the at least one side panels forming the cabinet, comprising;

a fan;

a fan housing having a top half and bottom half, the top half and the bottom half forming an internal cavity, an air inlet being located with one of the top and bottom halves, the fan being located within the internal cavity for directing air from the air inlet towards an open end of the fan housing; and, a front nozzle connected to the fan housing at the open end of the fan housing the front nozzle being adapted to direct air flow out of the open end of the fan housing in a direction generally at a right angle thereto.

13. A fan assembly for use in a computer cabinet, the cabinet having a top panel and at least one side panel connected to the top panel, the top panel and the at least one side panels forming the cabinet, comprising:

a fan;

a fan housing having a top half and bottom half, the top half and the bottom half forming an internal cavity, an air inlet being located with one of the top and bottom halves, the fan being located within the internal cavity for directing air from the air inlet towards an open end of the fan housing, the fan housing including an electrical junction box;

a front nozzle connected to the fan housing at the open end of the fan housing; and, a fan power cord connected between the electrical junction box and the fan.

14. A fan assembly, as set forth 13, further comprising a hollow rib located on an outer surface of the volute portion.

15. A fan assembly, as set forth in claim 14, wherein the fan power cord is located within the hollow rib.

16. A computer cabinet, comprising:

a frame having a bottom portion and a top portion, the bottom and top portion being connected by a plurality of upright members;

a top panel connected to the top portion of the frame;

at least one side panel connected to the plurality of upright members, the top panel and the at least one side panel forming an outer shape of the computer cabinet;

a fan housing having a top half and bottom half and being connected to the frame adjacent an aperture in the outer shape of the computer cabinet, the top half and the bottom half forming an internal cavity, an air inlet being located on one of the top and bottom halves, the internal cavity have a scroll portion and a volute portion, the volute portion having a narrow portion being connected to the scroll portion an expanding towards the open end of the housing;

a fan located within the internal cavity for directing air from the air inlet towards an open end of the housing; and, a front nozzle connected to the housing at the open end of the housing.

17. A computer cabinet, as set forth in claim 16, further including an air filter removably located within the front nozzle.

18. A computer cabinet, as set forth in claim 16, the front nozzle being adapted to direct air flow out of the open end of the housing in a direction generally at a right angle thereto.

19. A computer cabinet, comprising:

a frame having a bottom portion and a top portion, the bottom and top portion being connected by a plurality of upright members;

a top panel connected to the top portion of the frame;

at least one side panel connected to the plurality of upright members, the top panel and the at least one side panel forming an outer shape of the computer cabinet;

a fan housing having a top half and bottom half and being connected to the frame adjacent an aperture in the outer shape of the computer cabinet, the top half and the bottom half forming an internal cavity, an air inlet being located on one of the top and bottom halves, the internal cavity have a scroll portion and a volute portion, the volute portion having a narrow portion being connected to the scroll portion and expanding towards the open end of the housing, the fan housing including an electrical junction box;

a fan located within the internal cavity for directing air from the air inlet towards an open end of the housing; and, a fan power cord connected between the electrical junction box and the fan.

20. A computer cabinet, as set forth 19, further comprising hollow rib located on an outer surface of the volute portion.

21. A fan assembly, as set forth in claim 20, wherein the fan power cord is located within the hollow rib.

* * * * *